United States Patent
Oishi et al.

(10) Patent No.: US 6,674,277 B1
(45) Date of Patent: Jan. 6, 2004

(54) FREQUENCY MEASUREMENT CIRCUIT

(75) Inventors: Kazuaki Oishi, Kawasaki (JP); Hideki Ishida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 30 days.

(21) Appl. No.: 10/088,605

(22) PCT Filed: Aug. 18, 2000

(86) PCT No.: PCT/JP00/05574

§ 371 (c)(1),
(2), (4) Date: Mar. 19, 2002

(87) PCT Pub. No.: WO01/29969

PCT Pub. Date: Apr. 26, 2001

(30) Foreign Application Priority Data

Oct. 21, 1999 (JP) .......................................... 11-299986

(51) Int. Cl.[7] .............................................. G01R 23/02
(52) U.S. Cl. .................................. 324/76.39; 324/76.48
(58) Field of Search ............................ 702/66, 70, 74, 702/76, 106, 124, 189, FOR 103, FOR 104, FOR 107, FOR 110, FOR 134, FOR 154, FOR 170; 324/76.39, 76.42, 76.48, 76.16, 76.62

(56) References Cited

U.S. PATENT DOCUMENTS

| | | | | |
|---|---|---|---|---|
| 2,831,162 A | | 4/1958 | Gross | 368/118 |
| 2,992,384 A | * | 7/1961 | Malbrain | 324/76.58 |
| 3,518,540 A | * | 6/1970 | Roberts | 324/76.41 |
| 3,909,714 A | | 9/1975 | Nakano | 324/76.63 |
| 4,683,385 A | * | 7/1987 | Kaneko | 327/31 |
| 4,745,356 A | | 5/1988 | Henze | 324/76.35 |
| 4,854,105 A | * | 8/1989 | Delisle | 377/19 |
| 5,095,264 A | | 3/1992 | Hulsing, II | 324/76.47 |

FOREIGN PATENT DOCUMENTS

| | | |
|---|---|---|
| JP | A-57-211070 | 12/1982 |
| JP | A-2141024 | 5/1990 |
| SU | 1 239 618 A | 6/1986 |
| SU | 1 247 772 A | 7/1986 |
| SU | 1 596 462 A | 9/1990 |
| SU | 1 636 786 A | 3/1991 |

* cited by examiner

*Primary Examiner*—N. Le
*Assistant Examiner*—Vincent Q. Nguyen
(74) *Attorney, Agent, or Firm*—Arent Fox Kintner Plotkin & Kahn, PLLC

(57) ABSTRACT

A frequency measurement circuit comprises a plurality of frequency measurement units 10, 20, K0 each of which counts a reference clock Cb during a counting period having a predetermined number of waves of an input signal Cin, each of the frequency measurement units counts the reference clock, with shifted counting periods, respectively. Moreover, an adder 14 is provided to add the counted numbers of the plurality of the frequency measurement units. By shift the counting periods, even if the phase of the input signal agrees with the phase of the reference clock at the time counting starts and at the time counting ends on a certain frequency measurement unit, there is scarcely any possibility of agreement of the phases on other frequency measurement units. Therefore, by utilization of the added number of counts, frequency can be measured with high accuracy. In addition, by making the counting periods being shifted with overlaping each other, extension of the measurement time is not required any longer.

5 Claims, 11 Drawing Sheets

US 6,674,277 B1

FREQUENCY MEASUREMENT CIRCUIT

TECHNICAL FIELD OF THE INVENTION

The present invention relates to a frequency measurement circuit capable of measuring the frequency of an input signal, by counting the number of waves of the input signal for a specified period, and more particularly to a frequency measurement circuit that can measure the frequency with a higher accuracy than the conventional circuits. The frequency measurement circuit of the present invention is applicable to a time constant regulation circuit to be mounted in a semiconductor integrated circuit device, etc.

TECHNICAL BACKGROUND

When a circuit having a time constant like an oscillator or a filter is mounted in a semiconductor integrated circuit, the time constant could be changed, by a process change or operation conditions of the semiconductor integrated circuit. In order to keep the time constant (for instance, an oscillating frequency, or specific frequency) of these circuits in a specific range, a time constant regulation device has been used.

In Japanese Patent Application No. H10-222198 entitled "FILTER CHARACTERISTICS REGULATION METHOD AND APPARATUS" filed Aug. 6, 1998 by the present applicant, for instance, the time constant regulation device has been disclosed as a filter characteristic regulation device for regulating the characteristic frequency of a filter. Such a time constant regulation apparatus, for instance., enters a step signal containing a wide frequency band signal into a filter, to allow the filter to output the output signal corresponding to the characteristic frequency of the filter, and measures the frequency of the output signal, and supplies a control signal to the filter so that the obtained frequency can be a desired characteristic frequency. Generally, frequency is measured by counting the number of waves of a reference clock of the output signal during a specified cycle.

The adjustment accuracy of such a time constant regulation device as described above is significantly affected by an accuracy of a frequency measurement circuit, a component element of the device. As described above, in the case of entering a step signal to measure the frequency of the output signal, since the waveform of the output signal can decay in a short period of time, it is required to count the number of waves of a reference clock in a short period of time. Further, the frequency of the reference clock cannot be set with excessive freedom, due to the requirement of other circuits.

FIG. 11 is a configuration drawing of the conventional frequency measurement circuit. And, FIG. 12 shows an operating waveform diagram of the circuit. The frequency measurement circuit shown in FIG. 11 is a circuit to measure the frequency of the input signal Cin, and measures the cycle of the input signal Cin, utilizing the reference clock Cb having a shorter cycle than the input signal Cin, and known frequency. The frequency measurement circuit includes a select signal generator circuit 1 which counts the predetermined number of pulses (or number of waves) of the input signal Cin, when the input signal Cin is entered, and generates a select signal SEL during the counting, a selector circuit 2 to allow the reference clock Cb to pass through while the select signal SEL is an H level, and a reference clock wave number measurement circuit 3 to count the number of pulses (or number of waves) of the supplied reference clock Cb. Also, to the select signal generator circuit 1 and the reference clock wave number measurement circuit 3, both of which have a wave number measuring function, a reset signal Rst is supplied.

As shown in FIG. 12, when the cycle of the input signal Cin to be measured is expressed by tm, and the cycle of the reference clock C6 is expressed by tB, by counting the reference clock Cb during the period of the M cycle of the input signal Cin, the cycle of the input signal Cin can be measured, and further, the frequency fm of the input signal Cin can be obtained. As shown in the operating waveform diagram in FIG. 12, by the reset signal Rst having at an L level for the first time, the select signal generator circuit 1 and the reference clock wave number measurement circuit 3 is reset. And, during the M cycle of the input signal Cin corresponding to the time from t0 through tM, the select signal SEL is kept at the H level, and the reference clock Cb is supplied to the reference clock wave number measurement circuit 3. The reference clock wave number measurement circuit 3 counts, for instance, the number of the rising edges of the reference clock Cb during that time, and outputs the final counted value as the frequency measurement result OUT.

Generally, there are few cases where the phase of the input signal Cin perfectly agrees with the phase of the reference clock Cb. Therefore, by counting the rising edges (or the falling edges, or both of the rising and falling edges) of the reference clock Cb, during the period from the rising edge (t0) of the input signal Cin to the Mth rising edge (tM), the reference clock wave number measurement circuit 3 can count the number of waves N of the reference clock Cb with satisfactory accuracy. The period of counting can be either from the rising or the falling edge to the rising or falling edge.

However, when the edge of the input signal and the edge of the reference clock determining the operating period of both of the wave number measurement circuits 1 and 3 are agreed at the time when measurement starts, or when measurement ends, an error can take place in the measurement made by the reference clock wave number measurement circuit 3. In other words, as shown in FIG. 12, at the time when wave number counting starts to and at the time when the wave number counting ends tM, the phase of the input signal Cin may agree with the phase of the reference clock Cb. In such a worst case, a wave number measurement circuit in the reference clock wave number measurement circuit 3 can erroneously count the rising edge of the reference clock Cb, at the times tO and tM. This possibility is caused by the following two cases, e.g. (1) in the case where the circuit dose not count the rising edge of the reference clock Cb both at the times tO and tM; and (2) in the case where the circuit counts the rising edge of the reference clock Cb both at the times tO and tM. In the case of (1), the total number of counts is N−1, and in the case of (2), the total number of count is N+1. Here, when the rising edge of the reference clock is counted at either time of tO or tM, there is no problem, since the counted result is the same as the normal counted number.

In normal cases, if the counted number of waves of the reference clock measured by the reference clock wave number measurement circuit 3 is N to the measured wave number M of the input signal Cin, when the frequency of the reference clock is fB, the frequency fm of the input signal can be $$fm=(M/N)fB \qquad (1)$$

On the other hand, when both of the phases agreed, if the counted number of waves of the reference clock is N±1 to the measured wave number M of the input signal, the frequency fm of the input signal is $$fm = (M/(N \pm 1))fB \quad (2)$$

Accordingly, the measurement error is as the following equation.

$$\Delta f = \frac{M}{N \pm 1} f_B - \frac{M}{N} f_B = \frac{\mp M}{N(N \pm 1)} f_B \quad (3)$$

In the conventional examples, in order to improve the accuracy in the measured frequency, according to the equation (3), it can be considered to increase the counted number of waves N by increasing the measured wave number M, or, by increasing the frequency fB of the reference clock Cb to be counted by the wave number measurement circuit 3. However, if the measured number of waves M is increased, the measurement time becomes longer.

As described above, in the case of entering a step signal into a filter, and measuring the frequency of the output waveform outputted from the filter, since the output signal can decay in a short period of time, the measurement time is not preferable to be extended. Also, when the reference clock is heightened, the current consumption is increased, and moreover, since the reference clock cannot be set optionally in many cases, for reasons of using a semiconductor integrated circuit, thoughtless higher setting for the reference clock cannot be made.

It is therefore an object of the present invention to provide a frequency measurement circuit that enables the accuracy in measuring frequency to be improved, even when the measurement time is short.

Another object of the present invention is to provide a frequency measurement circuit that enables the accuracy in measuring frequency to be improved, without the need to raise the frequency of the reference clock.

SUMMARY OF THE INVENTION

To attain the above objects, an aspect of the present invention provides a frequency measurement circuit comprising a plurality of frequency measurement units each of which counts a reference clock during a counting period having a predetermined number of waves of an input signal, each of the frequency measurement units counts the reference clock, with shifted counting periods, respectively. Moreover, an adder is provided to add the counted numbers of the plurality of the frequency measurement units. By shifting the counting periods, even if the phase of the input signal agrees with the phase of the reference clock at the time counting starts and at the time counting ends on a certain frequency measurement unit, there is scarcely any possibility of agreement of the phases on other frequency measurement units. Therefore, by utilization of the added number of counts, frequency can be measured with high accuracy. In addition, by making the counting periods being shifted with overlapping each other, extension of the measurement time is not required any longer.

To attain the above objects, a second aspect of the present invention provides a frequency measurement circuit for measuring a frequency of an input signal, comprising:
 a first frequency measurement unit for counting the reference clock during a first counting period having a predetermined number of waves of the input signal;
 a second frequency measurement unit for counting the reference clock during a second counting period having the predetermined number of waves of the input signal; and
 an adder for adding the counted numbers of the first and the second frequency measurement units, wherein
 the first and second counting periods shift and overlap each other.

As to the first and the second frequency measurement units, three or more units may be employed, if necessary. In that case, it is preferable that the individual counting periods are also shifted each other.

To attain the above objects, a third aspect of the present invention provides a frequency measurement circuit for measuring a frequency of an input signal, comprising:
 a frequency measurement unit for counting a reference clock during a counting period having a predetermined number of waves of the input signal, wherein the frequency measurement unit counts the reference clock by assigning a lighter weight to the counts at a starting time and ending time of the counting period, compared with the other times.

In the case of the third aspect of the present invention, frequency measurement with high accuracy can be made without providing a plurality of frequency measurement units.

PREFERRED EMBODIMENTS OF THE INVENTION

Embodiments of the present invention will now be described with reference to the drawings. However, such embodiments are not intended to restrict the technical scope of the present invention.

Figure 1:
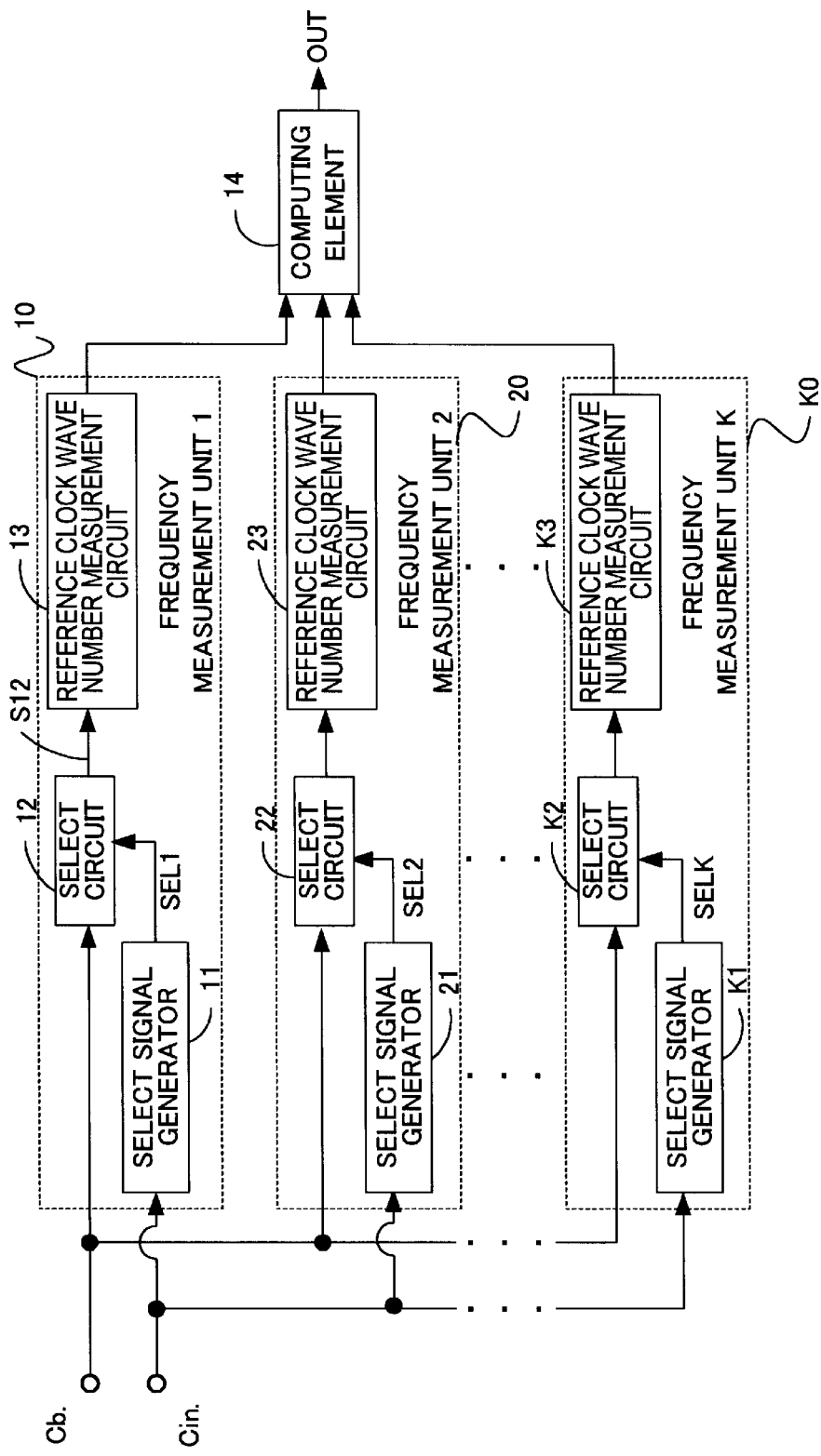
FIG. 1 shows the principle of an embodiment.

FIG. 1 shows the principle of the embodiment. According to the principle shown in FIG. 1, the frequency measurement circuit has a plurality of frequency measurement units 10, 20, . . . and K0. Like the conventional example, the frequency measurement unit 10 enters an input signal Cin into a select signal generator circuit 11 having a wave number measurement function, and generates a select signal SELL that causes a selector circuit 12 a pass through state during a specified wave number (=M). And, a reference clock wave number measurement circuit 13 counts wave number of the reference clock Cb passing through the selector circuit 12. The other frequency measurement units have the same configuration as this unit. However, the counting period of each of the frequency measurement units is shifted and partially overlapped. Therefore, the time when counting starts and the time when counting ends of each unit are not identical.

Herein, if the measured wave number during the counting period is M, the select signal generator circuit 11 synchronizes with the rising or the falling edge of the input signal Cin, or synchronizes with the rising and falling edges of the input signal, and causes the select signal an H level during the period where these edges number M are to be counted. As the result of this, the reference clock wave number measurement circuit 13 counts the reference clock Cb during the period where the wave number of the input signal being M. This wave number measurement circuit 13 counts the rising or the falling edge of the reference clock Cb, or both of the rising and the falling edges. In short, the selector signal generator circuit 11 operates as synchronizing with the period tm of the input signal Cin, and the reference clock wave number measurement circuit 13 operates as synchronizing with the period tB of the reference clock Cb. In that case, the frequency fm to be measured by each of the frequency measurement units 10, 20, and K0 is as expressed by $$fm = (M/N)fB \quad (4),$$

where the frequency of the reference clock Cb is fB.

In this embodiment, configuration is made to include a plurality of frequency measurement units, and to shift the time when each measurement unit starts measuring, by one cycle tm (or a plurality of cycles) of the input signal Cin. Wherein, in the case where the operating cycle of the select signal generator circuit 11 and the operating cycle of the reference clock wave number measurement circuit 13 (tm, tB) are in the indivisible relation, the phase relation between the input signal Cin (frequency fm) at the first frequency measurement circuit 10 and the reference clock Cb (frequency fB), and the phase relation between the input signal Cin (frequency fm) at the second frequency measurement unit 20 and the reference clock Cb (frequency fB) are mutually staggered. Therefore, if the edge timing of the input signal Cin agreed with the edge timing of the reference clock Cb at the time when measurement starts and at the time when measurement ends, at the first frequency measurement unit 10, these edge timings would fail to agree at the second frequency measurement unit 20.

Therefore, in the case when the phase relation between the input signal Cin (frequency fm) and the reference clock Cb (frequency fB) is not identical, on all of the plurality (=K) of the frequency measurement units, even if the phases agreed at a certain unit, on the other K−1 units, the phases do not agree. In short, at the K−1 units, erroneous counting of the reference clock cannot take place. As shown in FIG. 1, the counted number of each unit is added together at a computing element 14, and the frequency of the input signal is measured, depending on the total counted numbers. The error in the frequency measurement in the above case is expressed as follows:

$$\Delta f = \frac{KM}{(K-1)N + (N \pm 1)} f_B - \frac{KM}{KN} f_B \quad (5)$$

$$= \frac{\mp KM}{KN(KN \pm 1)} f_B$$

$$= \frac{\mp M}{N(KN \pm 1)} f_B$$

In other words, when the above expressions (3) and (5) are compared, it can be understood that, in this embodiment, the error in the frequency measurement is reduced to (N+1)/(KN+1) times of the case of the conventional method.

Figure 2:
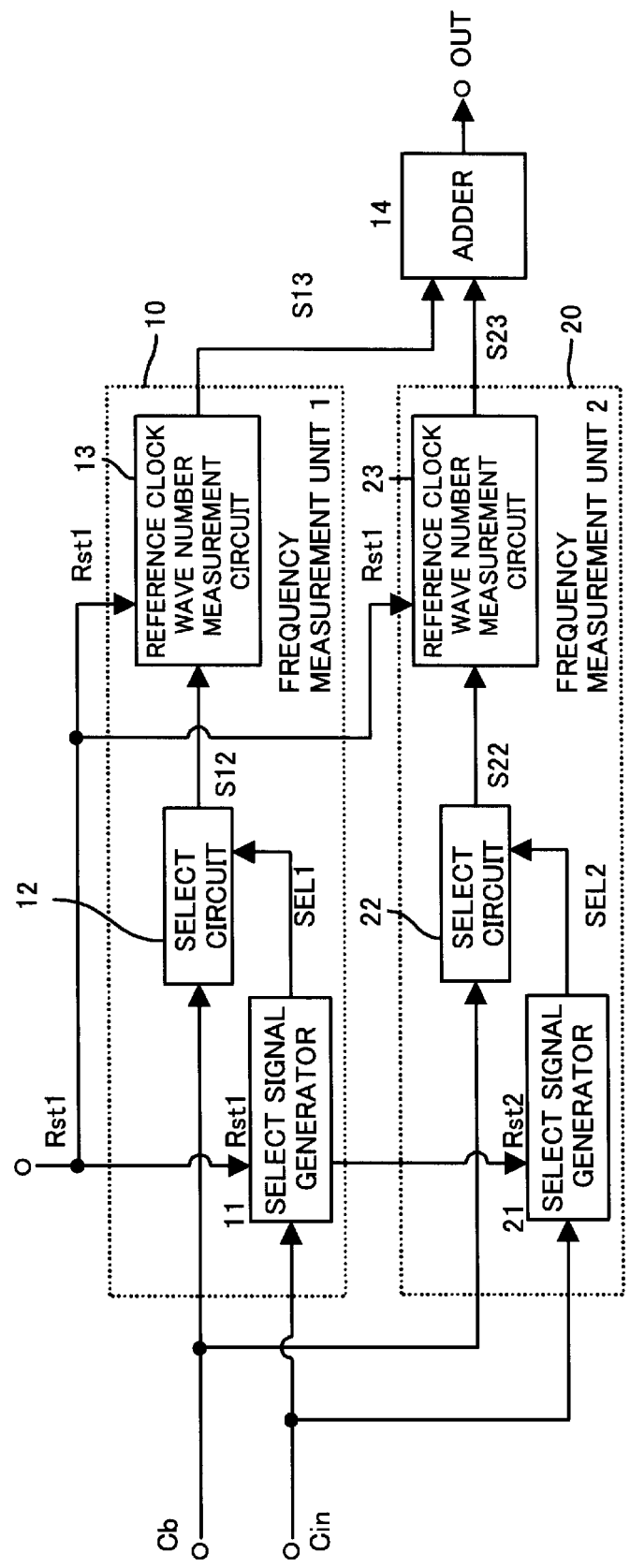
FIG. 2 shows the configuration of a frequency measurement circuit according to a first embodiment.
Figure 3:
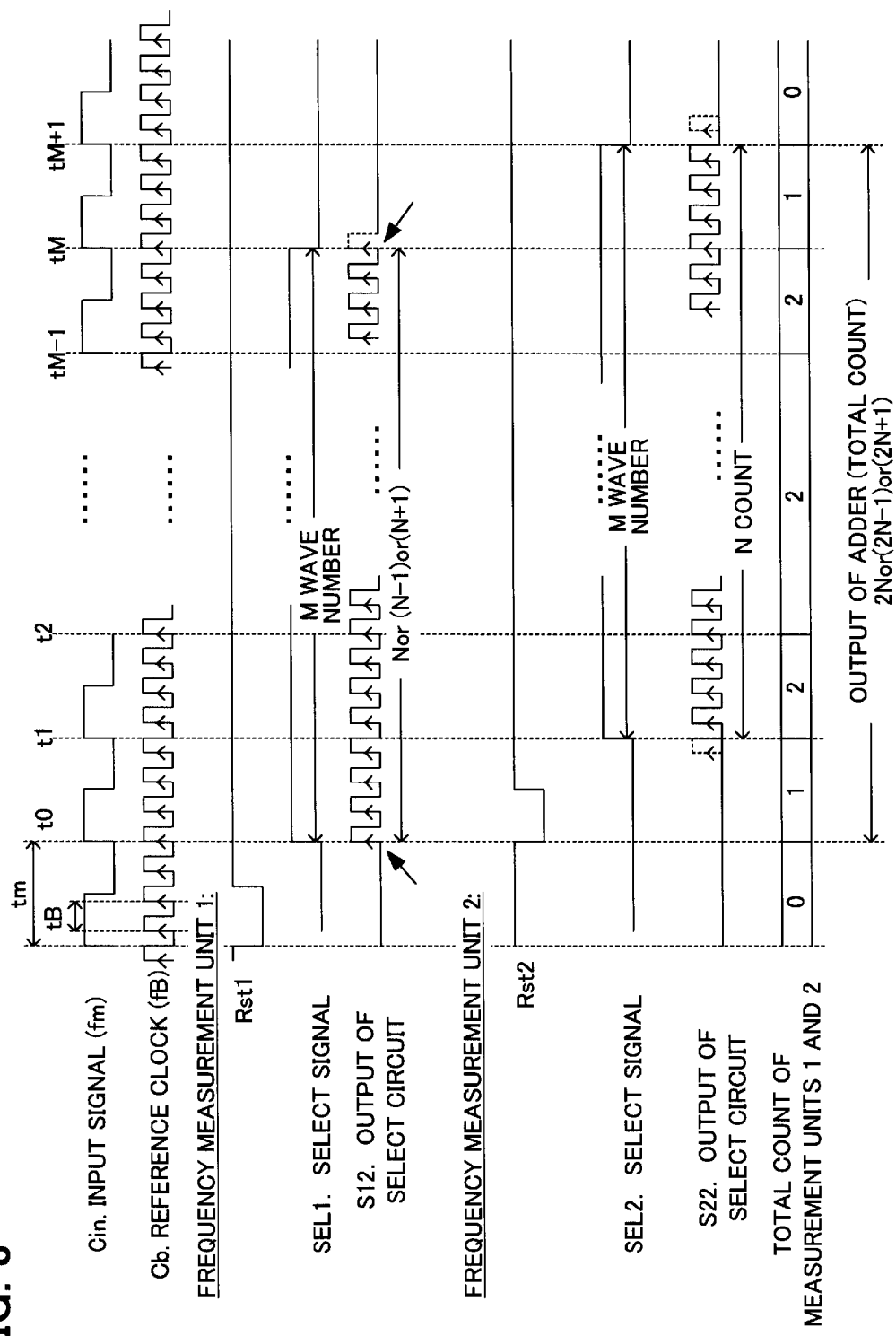
FIG. 3 is an operating waveform diagram of the frequency measurement circuit according to the first embodiment.

FIG. 2 shows the configuration of the frequency measurement circuit in a first embodiment. FIG. 3 shows the operating waveform of the circuit. This is an example, where the number of frequency measurement units is K=2, in FIG. 1 showing the principle. In addition, the number of waves during the counting period is M, and all of select signal generator circuits 11 and 21, and reference clock wave number measurement circuits 13 and 23 are to operate, as synchronizing with the rising edge of the input. In other words, a select signal will be kept on an H level during the period from the rising edge through the Mth rising edge of the input signal Cin. Also, the number of rising edges of the reference clock Cb will be counted as the number of waves.

As shown in FIG. 3, in this embodiment, the relation between the cycle tm of the input signal Cin and the cycles, tB of the reference clock Cb is tm:tB=3.5:1. Therefore, the phase (rising edge, 0°) of the input signal Cin agrees with the phase of the reference clock Cb at the times t0, t2, t4, . . . (when even numbered waveforms) shown in FIG. 3. However, at the times t1, t3, t5 . . . (when odd numbered waveforms), the phase 10 of the input signal Cin does not agree with the phase of the reference clock Cb.

A first reset signal Rst1 will be given to the select signal generator circuit 11 and the reference clock wave number measurement circuit 13 of a first frequency measurement unit 10. Also, the first reset signal Rst1 may be further given to a reference clock wave number measurement circuit 23 of a second frequency measurement circuit 20. In response to the reset signal Rst1, the select signal generator circuit 11 counts the M rising edges from the rising edge (t0) of the next input signal Cin, and generates the select signal SEL1 on H level, during the time up to tM. In response to the select signal SEL1, a select circuit 12 allows the reference clock Cb to pass through, and supplies the reference clock Cb to the reference clock wave number measurement circuit 13.

In response to the first reset signal Rst1, the reference clock wave number measurement circuit 13, whose counted number is already reset, starts counting of the number of the rising edges (number of waves) of the reference clock Cb.

On the other hand, in response to the first reset signal Rst1, the select signal generator circuit 11 generates a second reset signal Rst2, as synchronizing with the next rising edge (t0) of the input signal Cin. In response to the second reset signal Rst2, the circuit counts the M rising edges from the rising edge (t1) of the next input signal Cin, and generates a select signal SEL2 of H level, during the period up to the time tM+1. In response to the select signal SEL2, a reference clock wave number measurement circuit 23 in a second frequency measurement unit counts the rising edge of the reference clock Cb.

Then, the counted number of both of the unit 10 and the unit 20 are added by an adder 14, and the added counted number is outputted as the frequency measurement result OUT. By taking an inverse number after dividing the counted number by 2M, the frequency of the input signal Cin can be found.

Now, at the first frequency measurement unit 10, the phase of the input signal Cin agrees with the phase of the reference clock Cb at the counting start time t0 and the counting end time tM, and also the timings of both of the rising edges agree. Therefore, counting error can take place at the start point and the end point of the wave number measurement of the reference clock. In short, during the M cycle of the input signal, there are two cases when the counted number becomes N, or becomes N±1.

On the contrary, at the second frequency measurement unit 20, the counting period shifts from the counting period of the first unit by one cycle of the input signal. Therefore, if the input signal and the cycle or frequency of the reference clock are in the indivisible relation, the rising edge of the input signal never agrees with the rising edge of the reference clock at the start point t1 and the end point tM+1 of the counting period of the second unit 20. Therefore, at the second frequency measurement unit 20, there is no possibility of count error, and the counted number of the wave number of the reference clock during the M cycle of the input signal becomes N.

The total counted number added the counted number obtained by the first and the second frequency measurement units is, as shown in FIG. 3, whichever number of 2N, 2N−1, or 2N+1. Therefore, because there is the case when the counted number becomes a wrong counted number of 2N±1, against the correct counted number of 2N, frequency measurement error Δf becomes As follows:

$$\Delta f = \frac{2M}{N + (N \pm 1)} f_B - \frac{2M}{2N} f_B \quad (6)$$

$$= \frac{\mp 2M}{2N(2N \pm 1)} f_B$$

$$= \frac{\mp M}{N(2N \pm 1)} f_B$$

In short, it can be understood that frequency measurement error becomes (N+1)/(2N+1) times, compared with the conventional example.

In the above embodiment, as clearly understood from the expressions (5) and (6), by increasing of the number of frequency measurement units, K given in the expression (5) can be increased, and frequency measurement error can be made fewer. However, it is not preferable to simply increase the number of frequency measurement units, as such increase can only result in the increased scale of the integrated circuit. So, the following shows description of the minimum scale of a frequency measurement circuit that enables the minimum frequency measurement error to be obtained.

Figure 4:
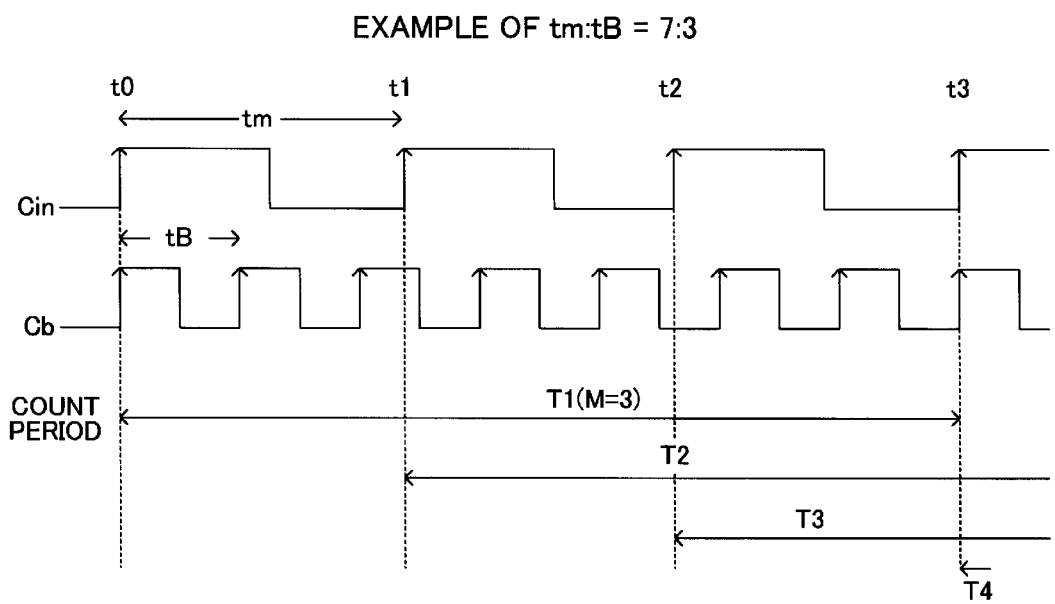
FIG. 4 is an operating waveform diagram showing an example of the case where the ratio of the cycle of the input signal to the cycle of the reference clock is 7:3.

FIG. 4 is an operating waveform diagram showing an example when the cycles of the input signal and the reference clock are in the ratios of 7:3. In the case when the cycles of the input signal Cin and the reference clock Cb are in the ratios of tm:tB=7:3, as shown in FIG. 4, if the rising edges of both of the clocks agree at the time t0, at the time t3 after 3 cycles of the input signal, the rising edges must agree again. And after the time t3, this relation of 3 cycles of the input signal will be simply repeated.

In such a case, by setting for the counting period, for example, T1 from the time t0 to t3, T2 from the time t1 to t4 delayed for one cycle, and T3 from the time t2, further delayed for one cycle, error can be minimized. In other words, even if counting error can take place at the counting period T1, at the counting periods T2 and T3, there is no possibility of counting error. And at the counting period T4 starting from the time t3, there is again a possibility of counting error.

Therefore, it can be understood from the value of K given in the above expression (5), that measurement error will become smaller when three frequency measurement units are set for the counting periods T1, T2 and T3, than when two frequency measurement units are set for the counting periods T1 and T2. However, if a frequency measurement unit having the counting period T4 is added, counting error can take place at two units, thereby resulting in the same measurement error as in the case of having two frequency measurement units.

That is, in the case of tm:tB=7:3 in FIG. 4, by setting of at least three frequency measurement units, measurement error can be minimized. In other words, in the case of having frequency measurement units of 3N units (N denotes a positive integer), this minimum measurement error can be kept. However, it is not preferable to increase the number of frequency measurement units to 6 units or 9 units, since such increase can only lead up to the increase in the power consumption, as well as the increase in the circuit scale.

Thus, the requirement for a minimum measurement error or a maximum measurement accuracy is to set frequency measurement units by at least the quotient obtained when the lowest common multiple of tm and tB are divided by tm, for the cycle tm of the input signal and the cycle tB of the reference clock. Or, even when the number of units is set by integer times of the quotient obtained when the lowest common multiple of tm and tB are divided by tm, the minimum error can be maintained.

Therefore, it is preferable to set the quantity of frequency measurement units that can embody the minimum error as described above, depending on the cycles of the input signal and the reference clock applicable to the frequency measurement circuit in this embodiment.

Figure 5:
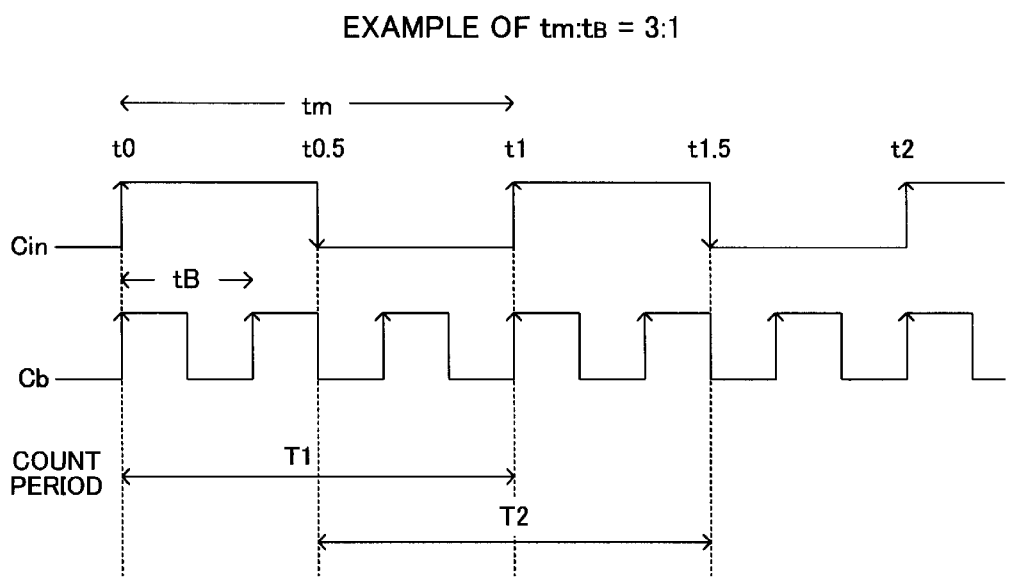
FIG. 5 is an operating waveform diagram showing an example of the case where the ratio of the cycle of the input signal to the cycle of the reference clock is 3:1.

FIG. 5 is an operating waveform diagram showing an example where the cycles of the input signal and the reference clock are in the ratios of 3:1. When the cycles of the input signal Cin and the reference clock Cb are in the ratios of tm:tB=3:1, since the cycles are in the divisible relation, as shown in FIG. 5, when the rising edges of both of the clocks agreed at the time t0, every rising edge of the input signal must agree with the rising edge of the reference clock. Therefore, even if the counting period is changed from t0 to t1, and from t1 to t2, at any measurement unit, counting error can take place.

Therefore, in such an example as shown in FIG. 5, a select signal is generated by utilization of both of the rising edge and the falling edge of the input signal Cin. In short, the select signal generator circuit in the first measurement unit generates a select signal with H level during a first counting period T1 from the time t0 to t1. Also, the select signal generator circuit in the second measurement unit generates a select signal with H level during a second counting period T2 from the time t0.5 to t1.5. That is to say, by setting of the cycle of the input signal Cin at tm/2, the newly set cycle tm/2 and the cycle tB of the reference clock are not in the divisible relation, tm:tB=1.5:1, therefore, at the time t0.5, the rising edge of the reference clock never agrees with the rising edge of the input signal.

As described above, when the input signal and the reference clock are in the relation as shown in FIG. 5, by utilization of both of the input signal edges, the cycles of both of the clocks can be in the indivisible relation so that a frequency measurement circuit with a fewer error accuracy using a plurality of counting cycles can be embodied.

Additionally, in the case shown in FIG. 4, the reference clock wave number measurement circuits 13 and 23 are also able to count both of the rising edge and the falling edge of the reference clock Cb. The reason is, unlike the case shown in FIG. 3, that the falling edge of the reference clock does not agree with the rising edge of the input signal at the times t1 and t2. In the case when both of the edges of the reference clock are to be counted, the counting number can be doubled at the same counting period, so as to make error smaller.

In the case of utilizing both of the edges of the input signal or the reference clock, the defined cycles tm, and tB can be replaced with a semi-cycles. Therefore, in the case shown in FIG. 5, from the relation between the semi-cycle tm of the input signal and the semi-cycle tB of the reference clock, the quantity of measurement units in the case of becoming the minimum accuracy can be specified.

Figure 6:
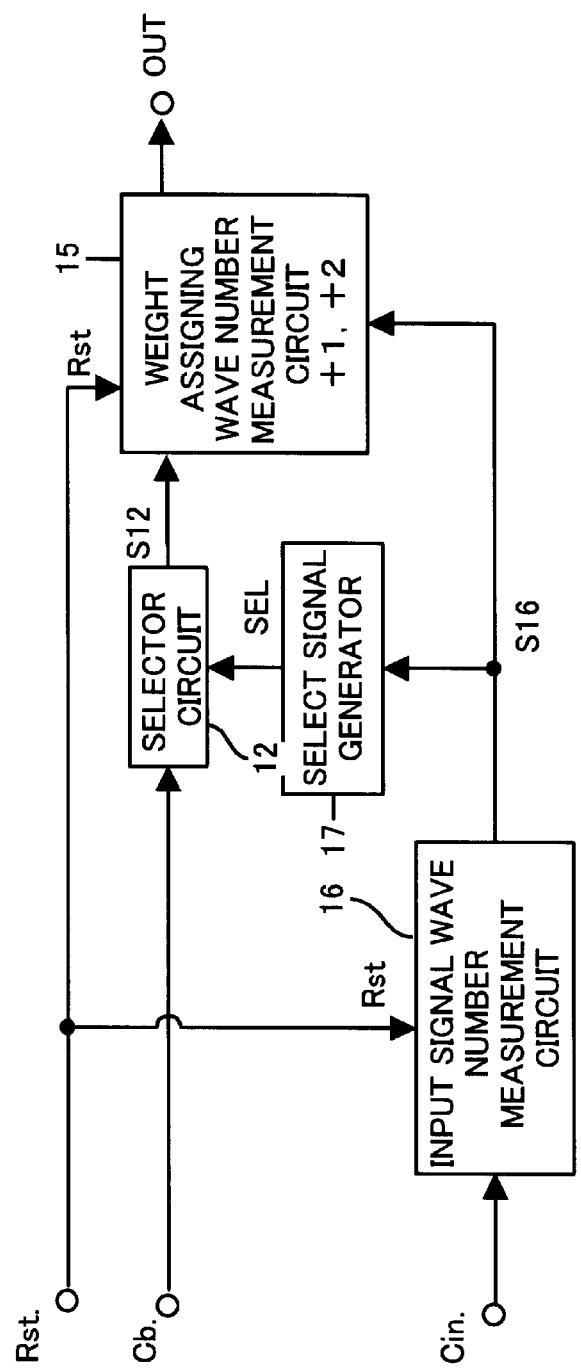
FIG. 6 shows the configuration of a frequency measurement circuit according to a second embodiment.

FIG. 6 shows a configuration of the frequency measurement circuit in a second embodiment. In the second embodiment, a plurality of frequency measurement units are not set for the circuit like the first embodiment, but the circuit has only a single frequency measurement unit. And, because the unit counts, as assigning a lighter weight to the counting at the time when the counting period starts and at the time when the counting period ends, compared with the counting at the other times, the same result can be substantially obtained as in the case when the wave number of the reference clock is to be counted at a plurality of shifted counting periods.

On the frequency measurement circuit shown in FIG. 6, and an input signal wave number measurement circuit 16 to be supplied with the input signal Cin and to measure the wave number of the input signal is provided. The input signal wave number measurement circuit 16 counts the wave number of the input signal Cin, in response to the reset signal Rst, and outputs its counted value as a wave number measurement result signal S16. A select signal generator 17 causes the select signal SEL an H level during the time from count 1 up to a specified count (for instance, M+1), in response to the wave number measurement result signal S16. A select circuit 12 allows the reference clock Cb to pass through while the select signal SEL remains on an H level, and supplies its reference clock to a weight assigning wave number measurement circuit 15.

The weight assigning wave number measurement circuit 15 counts the wave number of the reference clock, with the amount of weighting depending on the wave number measurement result signal S16. The amount of weighting is set so that the amount of weighting at the time when counting starts and at the time when counting ends is smaller than the amount of weighting at other times.

Figure 7:
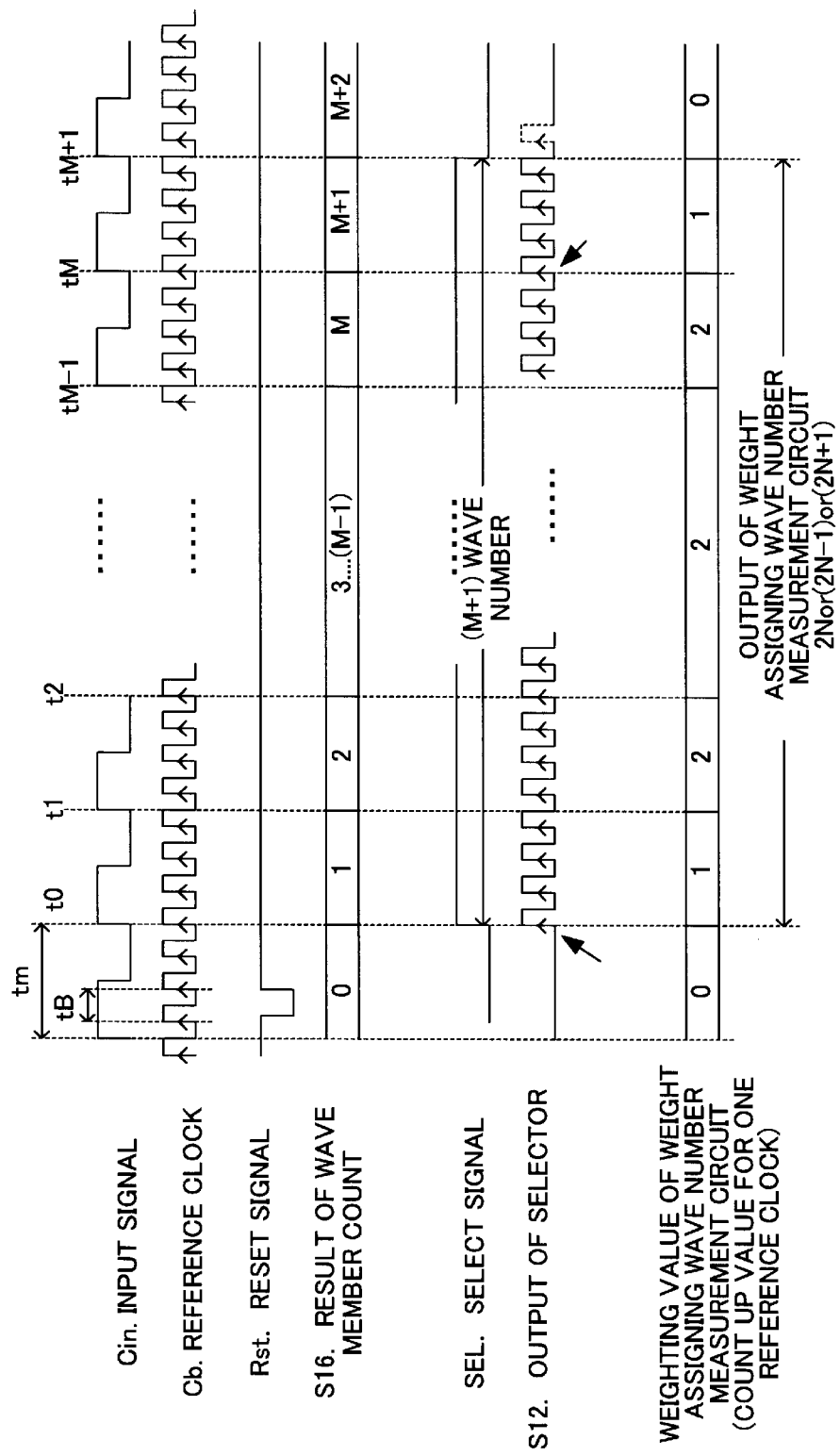
FIG. 7 is an operating waveform diagram of the frequency measurement circuit according to the second embodiment.

FIG. 7 shows an operating waveform of the frequency measurement circuit in the second embodiment. This is also an example where out of the rising edges of the input signal Cin, the rising edges of the input signal agree with the rising edges of the reference clock Cb at the times t0, t1, t4, . . . And the counting period is the period from the time t0 to M+1 cycles of the time tM+1.

As described above, the input signal wave number measurement circuit 16 starts counting of the wave number of the input signal Cin, in response to the reset signal Rst. Therefore, the count value S16 increases, such as at the time t0, the count value S16 becomes "1", at the time t1, the count value S16 becomes "2", and so on. As the selector signal SEL becomes an H level, the supply of the reference clock Cb to the weight assigning wave number measurement circuit 15 starts from the time t0.

The weight assigning wave number measurement circuit 15 changes the amount of weighting for counting, based on the wave number measurement result signal (count value) S16. As shown in FIG. 7, the circuit counts with the amount of weighting 1 at the cycle of the time t0, and from the cycle of the time t1 to the cycle of the time tM, the circuit counts with the amount of weighting 2, and further, at the cycle of the time tM+1, the circuit counts with the amount of weighting 1 again. As the result, the weight assigning wave number measurement circuit 15 will count the total value obtained when the value counted the wave number of the reference clock during the counting period from the time t0 to the time tM is added to the value counted the wave number of the reference clock during the period from the time t1 to the time tM+1. In short, the counted result will be the same as the result obtained in the first embodiment shown in FIG. 2.

Figure 8:
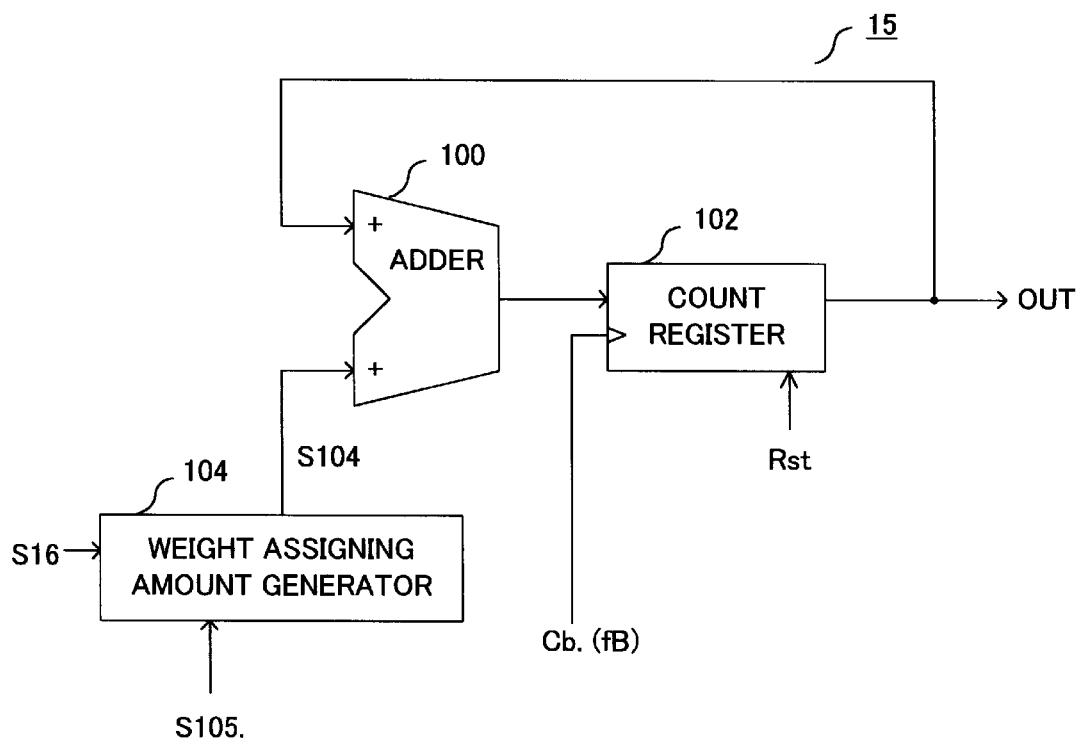
FIG. 8 shows the configuration of a weight assigning wave number measurement circuit.

FIG. 8 shows a configuration of a weight assigning wave number measurement circuit. The weight assigning wave number measurement circuit 15 shown in FIG. 8 has an adder 100, a count register 102 to hold the output of the adder, as synchronizing with the reference clock Cb, and a weight assigning amount generator circuit 104 to supply the weight assigning amount S104 to one of the input of the adder 100. The output OUT of the count register 102 is supplied to the other input of the adder 100. The weight assigning amount generator circuit 104 generates the weight-assigning amount S104, in accordance with the wave number measurement result signal S16 to be supplied. As described in FIG. 7, for the amount of weighting, for instance, the minimum value of 1 is set for the amount at the time when the counting period starts, and after that time, 2 set for the amount while the wave number measurement result S16 is between 2 through M, so that at the last cycle of the counting period, the value becomes the minimum value of 1. Or, the amount of weighting can be set, so that the values become 1, 2, 3, 3 . . . 3, 2 and 1. In this case, the same result can be obtained, as when K=3 in FIG. 1.

The weight assigning wave number measurement circuit shown in FIG. 8 synchronizes with the reference clock Cb, and the adder 100 adds the amount of weighting S104 to the counted value registered in the count register 102. The added value is held in the count register 102.

As shown in FIG. 7, in the second embodiment, even if the rising edge of the input signal agrees with the rising edge of the reference clock at the time t0, or tM, counting failure can take place at the time t0 and counting error becomes −1, and also, at the time tM, the amount of weighting becomes 2 or 1, and the counting error can become +1, so, the resultant counted value becomes whichever one of 2N, 2N−1, or 2N+1. Therefore, the error accuracy is the same as given in the above expression (6).

Now, the description is already made that in the first embodiment, by employing of the quotient obtained when the minimum common multiple of the cycles of the input signal and the reference clock are divided by the cycle of the input signal as the quantity of frequency measurement units, error can be minimized. In the second embodiment, by changing the amount of weighting, the quantity of the frequency measurement units shown in FIG. 1 can be substantially changed. For instance, according to an external setting signal S105, the amount of weighting is set as $$1, 2, 2 \ldots 2, 1: \qquad (1)$$

$$1, 2, 3, 3 \ldots 3, 2, 1; \text{ or} \qquad (2)$$

$$1, 2, 3 \ldots L, L \ldots L \ldots 3, 2, 1 \qquad (3)$$

and, the same measurement result can be obtained as in the case where the quantity of K=2, K=3, or K=L of frequency measurement units are provided. Therefore, if the amount of weighting can be set externally, a general-purpose frequency measurement circuit can be embodied.

Therefore, for the cycle tm of the input signal and the cycle tB of the reference clock, the amount of weighting for obtaining the maximum accuracy must include types at least equivalent to the quotient obtained when the lowest common multiple of tm and tB are divided by tm. In short, it is satisfactory to set the value of the L given above to the quotient obtained when the lowest common multiple of tm and tB are divided by tm.

The amount of weighting described above is not necessarily a positive number. It may be a negative number, and in this case, its absolute number becomes the minimum value at the time when counting starts and at the time when counting ends, and only requirement is that the amount of weighting gradually increases or decreases.

Figure 9:
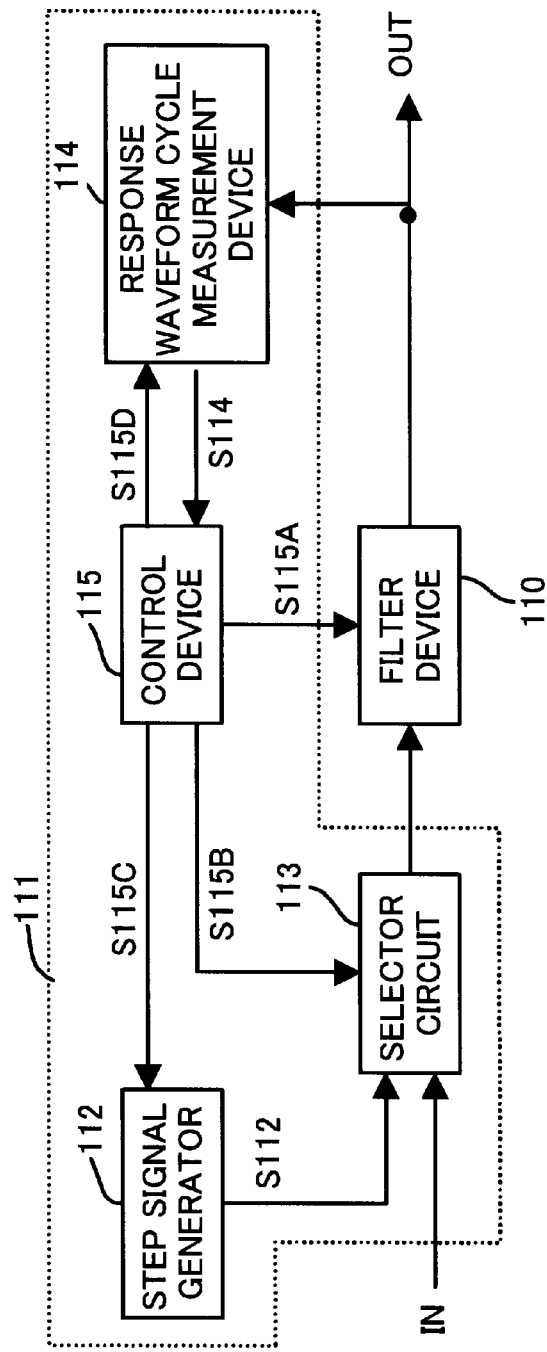
FIG. 9 shows the configuration of a filter characteristic adjustment circuit, an applied example of the frequency measurement circuit.
Figure 10:
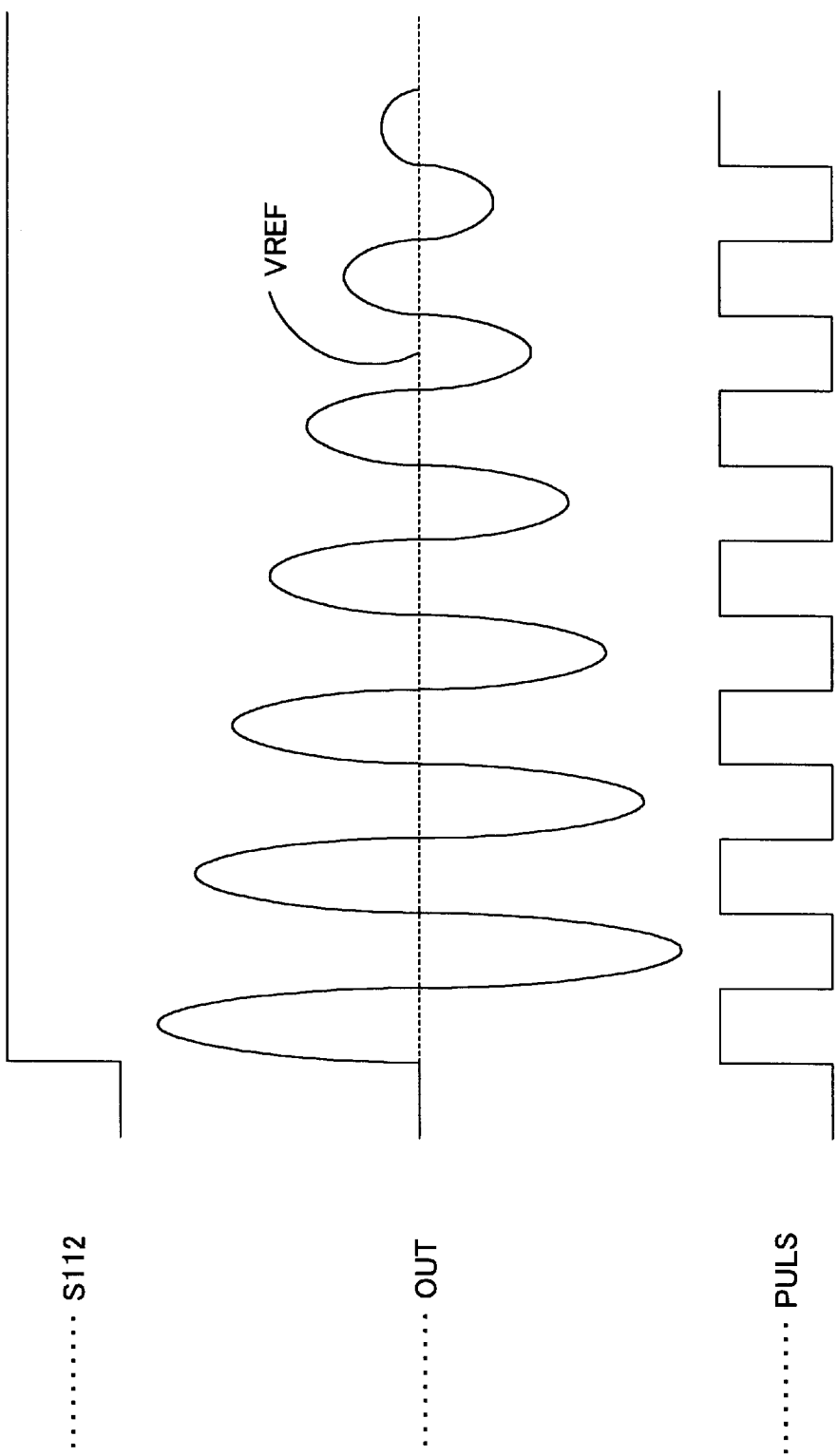
FIG. 10 is an operating waveform diagram of the filter characteristic adjustment circuit shown in FIG. 9.
Figure 11:
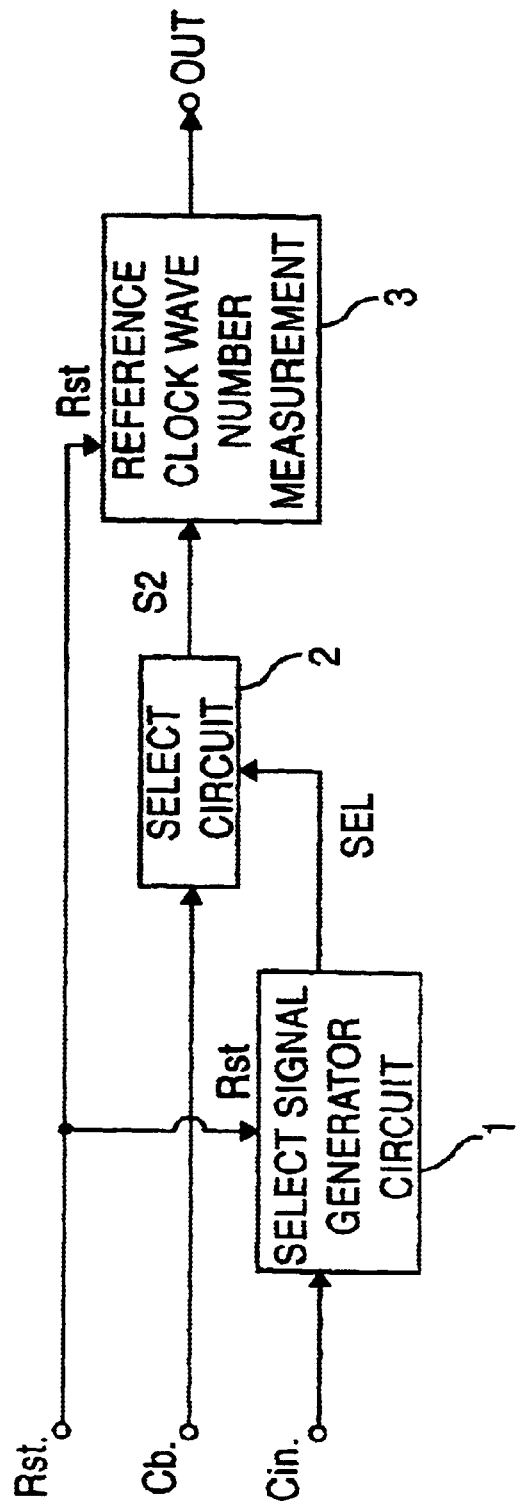
FIG. 11 shows the configuration of a conventional frequency measurement circuit.
Figure 12:
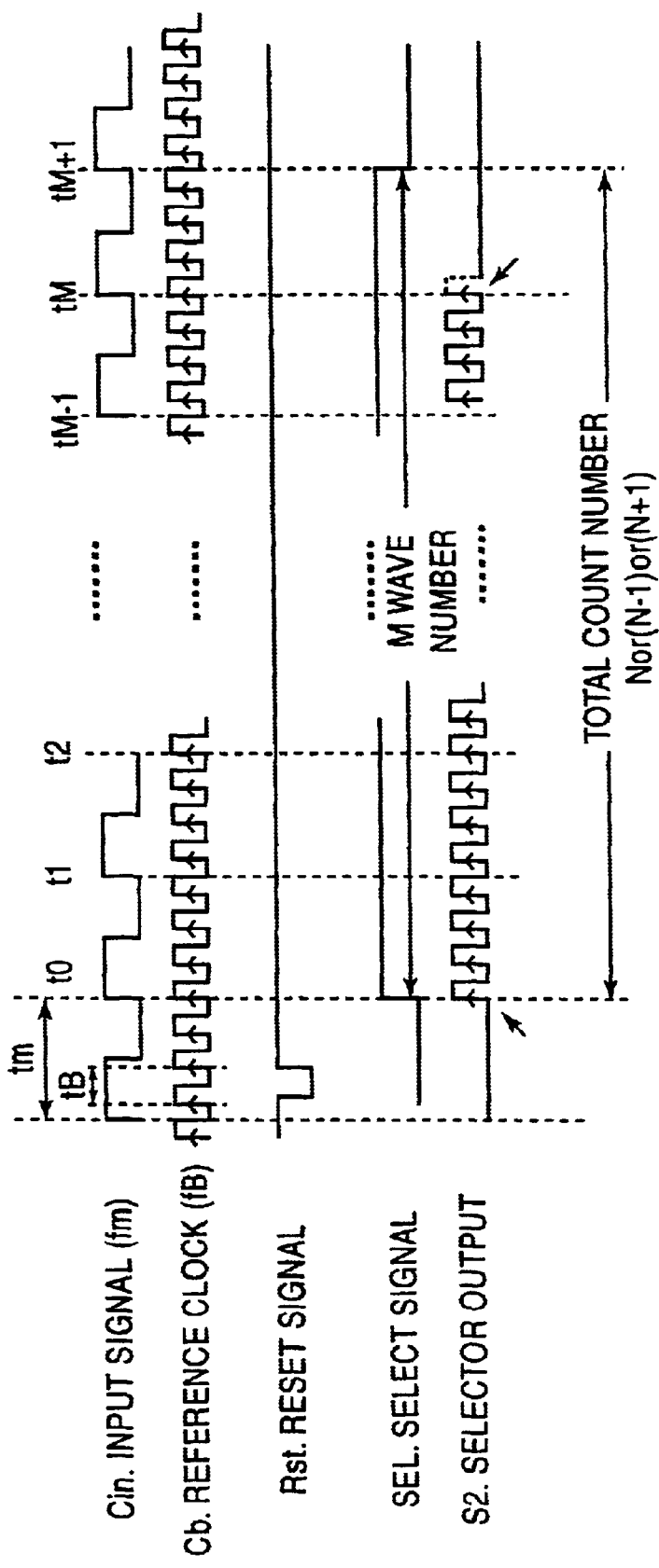
FIG. 12 is an operating waveform diagram of the conventional frequency measurement circuit.

FIG. 9 shows a configuration of a filter characteristic adjustment circuit, an application example of the frequency measurement circuit. FIG. 10 is an operating waveform diagram of the adjustment circuit. In this example, the characteristic frequency of a filter device 110 made by a semiconductor integrated circuit is measured, and adjustment of the frequency is made possible. In FIG. 10, the control device 115 generates a characteristic frequency control signal S115A, a selector control signal S115B, a step control signal S115C, and a measurement control signal S115D. In the adjustment process, a step signal generator device 112 generates the step signal S112 shown in FIG. 10, and supplies the generated step signal. S112 to a filter device 110 through a selector circuit 113. The step signal S112 includes a signal of a wide frequency band. Therefore, a signal having the frequency corresponding to the characteristic frequency of the filter device 110 will be outputted as the output signal out of the filter device. If the filter device is a band-pass filter, the characteristic frequency is the center frequency of its pass-through band. The response waveform out, which passed through the filter device 110 is, as shown in FIG. 10, a signal, which decays in a short period of time.

A response waveform cycle measurement device 114 corresponds to the frequency measurement device in this embodiment. The response waveform frequency measurement device 114 has a comparator function to compare the response waveform out and the measurement reference level Vref and to generate the pulse signal PULS shown in FIG. 10. This pulse signal PULS is supplied as the input signal of the frequency measurement device in this embodiment. And, by counting of the reference clock in a short period of time, the frequency (cycle) of this pulse signal will be measured.

The response waveform cycle measurement device 114 gives the measurement result S114 to a control device 115, and the control device 115 supplies a characteristic frequency control signal S115A to the filter device 110, depending on the measurement result, to adjust the characteristic frequency. When the adjustment finished, dispersion of the process or dispersion of the characteristic frequency associated with the operating environment will be removed. After the removal, a selector device 113 switches to the input signal side, and supplies the received signal IN of a cellular phone, etc. to the filter device 110 to obtain the output signal out of the filter device 110. The above application example is nothing but an example.

In accordance with the above embodiments, this embodiment will be summarized as follows.

The protective scope of the present invention is not limited to the embodiments described above, but the coverage extends to the invention defined in claims and to its equivalents.

Industrial Applicability

As described above, the present invention enables the frequency measurement device to minimize the measurement error (to improve the accuracy in measurement) without the need to extend the measurement time. Moreover, the present invention enables the frequency measurement device to improve the accuracy in measuring frequency, without the need to raise the frequency of the reference clock.

What is claimed is:

1. A frequency measurement circuit for measuring a frequency of an input signal, comprising:

a first frequency measurement unit for counting a reference clock during a first counting period having a predetermined number of waves of the input signal;

a second frequency measurement unit for counting the reference clock during a second counting period having a predetermined number of waves of the input signal; and an adder for adding the counted numbers of the first and the second frequency measurement units, wherein the first and second counting periods shift overlap each other.

2. The frequency measurement circuit according to claim 1, wherein the first and the second frequency measurement units each include:

a select signal generator circuit for counting a predetermined number of waves of the input signal and generate a select signal during the counting period;

a select circuit for allowing a supply of the reference clock in response to the select signal; and a reference clock frequency measurement circuit for counting the reference clock supplied from the select circuit.

3. The frequency measurement circuit according to claim 1, wherein the number of the frequency measurement units is at least equal to a quotient of the lowest common multiple of tm and tB divided by tm, where tm is the cycle of the input signal and tB is the cycle of the reference clock.

4. The frequency measurement circuit according to claim 1 or 3, wherein the input signal is a clock signal, and wherein the counting period starts from a rising edge or a falling edge of the input clock signal and ends at the rising edge or the falling edge of the input signal respectively.

5. The frequency measurement circuit according to claim 4, wherein the predetermined number of waves of the input signal is the number of the rising edges, the number of the falling edges or the number of rising and falling edges of the input clock signal.

* * * * *